United States Patent [19]

Debesis

[11] 3,871,016

[45] Mar. 11, 1975

[54] REFLECTIVE COATED CONTACT FOR SEMICONDUCTOR LIGHT CONVERSION ELEMENTS

[75] Inventor: John R. Debesis, Richmond Heights, Ohio

[73] Assignee: General Electric Company, Schenectady, N.Y.

[22] Filed: Dec. 26, 1973

[21] Appl. No.: 427,936

[52] U.S. Cl. ........................ 357/68, 357/17, 357/67, 357/81

[51] Int. Cl. ............................ H01l 3/00, H01l 5/00

[58] Field of Search ............. 317/234, 5, 1, 5.2, 5.4, 317/4, 235, 27, 31

[56] References Cited

UNITED STATES PATENTS

| | | | |
|---|---|---|---|
| 3,058,041 | 10/1962 | Happ | 317/234 G |
| 3,255,393 | 6/1966 | Hutchins et al. | 317/235 UA |
| 3,332,867 | 7/1967 | Miller et al. | 317/234 A |
| 3,386,867 | 6/1968 | Staples | 317/234 L |
| 3,448,349 | 6/1969 | Sumner | 317/235 UA |
| 3,684,930 | 8/1972 | Collins et al. | 317/234 L |
| 3,728,785 | 4/1973 | Schmidt | 317/234 L |
| 3,753,804 | 8/1973 | Tijburg et al. | 317/234 L |

*Primary Examiner*—Andrew J. James
*Attorney, Agent, or Firm*—Norman C. Fulmer; Lawrence R. Kempton; Frank L. Neuhauser

[57] ABSTRACT

A plurality of individual contact areas are distributed over a surface of a semiconductor light conversion element such as a light-emitting diode. A layer of reflective material such as a refractory metal is deposited over the surface and the element is cemented, at the reflective layer, to the surface of a conductor member by means of electrically conductive cement.

6 Claims, 3 Drawing Figures

PATENTED MAR 1 1 1975 3,871,016

REFLECTIVE COATED CONTACT FOR SEMICONDUCTOR LIGHT CONVERSION ELEMENTS

CROSS-REFERENCES TO RELATED APPLICATIONS

Ser. No. 427,803, John R. Debesis, "Method of Making Contacts to Semiconductor Light Conversion Elements", filed concurrently herewith and assigned the same as this invention.

Ser. No. 427,935, John R. Debesis, "Reflective Contact for Semiconductor Light Conversion Elements", filed concurrently herewith and assigned the same as this invention.

BACKGROUND OF THE INVENTION

The invention is in the field of solid state light conversion devices employing light-emitting diodes or light-sensitive diodes and functioning in the infrared or visible light spectrum. In solid state lamps, the light-emitting diode is made from a flat "chip" of material, such as gallium arsenide, gallium phosphide, gallium arsenide phosphide or silicon carbide, suitably doped with dopant material so as to form a p-n junction which emits light (visible or infrared) when current is passed therethrough. The p-n junction is between and parallel to the "top" and "bottom" surfaces of the diode, it being assumed for convenience that the light to be utilized is that which emerges through the top surface. Of the light emitted by the p-n junction, only a small amount exits through the top surface of the diode, due to the effect of the "critical angle" caused by the high index of refraction of the diode material whereby only the light rays approaching the top surface perpendicularly and approximately perpendicularly can pass through the surface and become usefully emitted light, whereas the remaining majority of light rays are internally reflected at the top surface.

The amount of light emitted through the top surface of the diode can be increased by encapsulating the top surface of the diode with a material having a refractive index greater than unity, i.e. greater than that of air, thereby increasing the critical angle whereby a greater amount of light exits through the top surface, as described in U.S. Pat. No. 3,676,668 to Collins, Kerber, and Neville. The aforesaid patent also discloses a way of increasing the amount of emitted light by mounting the bottom of the diode on a mechanical support and electrical contact member in a manner so that a major portion of the bottom surface is bounded by air or other low optical refractive index material so as to reduce the critical angle and hence increase internal light reflection at the bottom surface, thereby increasing the amount of light emitted upwardly through the top surface of the diode.

SUMMARY OF THE INVENTION

Objects of the invention are to provide improved reflective contacts to semiconductor light conversion elements, which can be manufactured easily and at low cost, and to increase the efficiency and light output of such elements.

The invention comprises, briefly and in a preferred embodiment, a plurality of individual low resistance electric contact areas distributed over and attached to a surface of a semiconductor light conversion element, a layer or reflective material such as a refractory metal deposited over said surface, and means electrically bonding said reflective layer to the surface of a conductor member. The aforesaid electric contact areas can but need not be raised from the surface of the element. The aforesaid reflective layer can but need not cover over the contact areas. The aforesaid bonding means may be electrically conductive cement.

DESCRIPTION OF THE PREFERRED EMBODIMENTS

Figure 1:
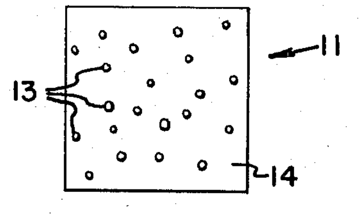
FIG. 1 is a top view of a p-n junction semiconductor light conversion element having distributed individual low resistance electric contact areas on a surface thereof.

A p-n junction semiconductor light conversion element 11, such as a light-emitting diode or a light-sensitive diode, has a p-n junction 12 therein substantially parallel to the top and bottom surfaces thereof. The element 11 may be made from suitably doped gallium arsenide, gallium phosphide, or other suitable materials. A plurality of individual low resistance electric contact areas 13 are distributed over a surface 14 of the element 11. The contact areas 13 may be formed by applying a layer of metal over the semiconductor surface 14 and heating to a temperature such that the metal layer dissociates into the distributed areas 13 in the form of individual lumps of metal sintered or allowed to the semiconductor surface 14. For a n-doped gallium phosphide semiconductor, for example, a suitable metal for the aforesaid layer is a gold-12 weight percent germanium eutectic, which is temporarily heated to about 550°C to 600°C for a time of about two to five minutes, in a reducing atmosphere, thereby causing the distributed raised areas 13 to form. Further details of this method are disclosed in the above-referenced patent application Ser. No. 427,803. Preferably, only a small amount (such as 5 percent) of the total area of the surface 14 is occupied by the metal contact areas 13, the remaining major portion (such as 95 percent) of the surface area being free of metal.

Another method of forming the contact areas 13 is to place over the semiconductor surface 14 a mask having a plurality of openings through which a metal is evaporated, sputtered, or otherwise deposited on the surface 14 to form the contact areas 13; the mask is removed and the assembly is heated to sinter or alloy the metal areas onto the surface 14 to form low resistance electric contacts. The relative size of the contact areas 13 is exaggerated in the drawing, and may have maximum heights of about 0.01 mm, for example. The contact areas need not be raised, and may be very thin or coplanar with the surface 14 of the light conversion element.

Figure 2:
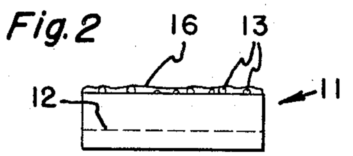
FIG. 2 is a side view of the light conversion element, with a layer of reflective material deposited over the surface having the contact areas.

A layer 16 of reflective material is deposited over the surface 14, as shown in FIG. 2. Preferably, the layer 16 is a refractory metal; titanium, for example, is found to adhere well to a gallium phosphide light conversion element 11. Other refractory metals, such as molybdenum and nickel, should be feasible. The reflective metal can be evaporated, by wellknown methods, onto the surface 14, and provides a good reflective interface with the surface 14 for reflecting light internally at that surface. The metal reflective layer 16 must not be fused nor sintered onto the surface 14 of the element 11, for to do so would cause this interface to absorb, rather than reflect, light in the element 11.

Figure 3:
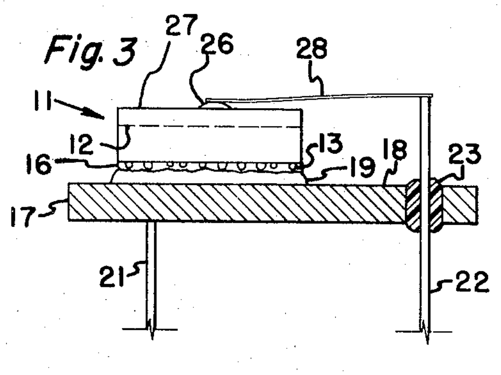
FIG. 3 is a side view of the light conversion element of FIG. 2, with the layer of reflective material bonded to a header by a layer of electrically conductive cement.

The semiconductor element 11 of FIG. 2 is turned over and positioned at a conductor member such as a metal header 17, as shown in FIG. 3, and the reflective layer 16 is bonded to the surface 18 of the header by means of electrically conductive cement 19 such as epoxy cement. The construction is completed by providing a lead-in conductor 21 attached to the header 17, and a second lead-in conductor 22 extending through an opening in the header 17 and held in place and electrically insulated from the header by a glass or ceramic bead 23. A small dot electrical contact 26 is provided on the now top surface 27 of the element 11, and is connected by means of a fine wire 28 to the upper end of the lead-in wire 22, as described in the above-referenced patent. The structure may be encapsulated as described in the above-referenced patent, or may be provided with a cylindrical cap and lens as described in U.S. Pat. No. 3,458,779, issued July 29, 1969 to Drs. Blank and Potter. In operation, the reflective layer 16 at surface 14 of the element 11, which is the "bottom" of the lamp construction of FIG. 3, reflects upwardly a considerable amount of downwardly directed light emitted by the junction 12; of this upwardly reflected light, a considerable amount emerges upwardly through the top surface 27, along with light emitted upwardly from the junction 12.

Although the deposited reflective layer 16 makes relatively poor electrical contact to the semiconductor element 11, it makes good electrical contact to the contact areas 13, which in turn make good electrical contact to the semiconductor element 11. The distribution of the contact areas 13 provides substantially uniform current density over the contact surface 14, which is desirable. Although the distributed contacts 13 are shown as being raised, this is not necessary; the contacts 13 can be flush with the surface 14. Although the reflective layer 16 is shown as covering the distributed contacts 13 as well as the semiconductor surface 14, this is not necessary; the reflective layer 16 can cover only some of the contact areas 13 and not cover others, or can partially cover some or all of the contact areas 13, or need not cover over nor be in electrical contact with any of the contact areas 13, in which event any exposed contact areas 13 at the reflective layer 16 will be electrically contacted by the cement 19.

While preferred embodiments and modifications of the invention have been shown and described, other embodiments and modifications will become apparent to persons skilled in the art and will be within the scope of the invention as defined in the following claims.

What I claim as new and desire to secure by Letters Patent of the United States is:

1. A contact construction for attaching a solid state light conversion element to a conductor member, comprising a plurality of individual electrical contact areas distributed over and attached to a surface of said light conversion element, a layer of reflective material disposed over and in contact with said surface, and bonding means electrically bonding said reflective layer and any exposed contact areas to a surface of said conductor member.

2. A construction as claimed in claim 1 in which said reflective material comprises a refractory metal.

3. A construction as claimed in claim 2 in which said reflective layer covers over and is in contact with said contact areas.

4. A construction as claimed in claim 2 in which said contact areas are raised from said surface of the light conversion element.

5. A construction as claimed in claim 4 in which said reflective layer covers over and is in contact with said contact areas.

6. A construction as claimed in claim 1 in which said bonding means comprises electrically conductive cement.

* * * * *